United States Patent [19]

Kolluri et al.

[11] 4,308,467

[45] Dec. 29, 1981

[54] ELECTRONIC CIRCUITRY

[75] Inventors: M. V. Kolluri, Sunnyvale; Clyde M. Brown, Jr., Cupertino, both of Calif.

[73] Assignee: Raytheon Company, Lexington, Mass.

[21] Appl. No.: 90,813

[22] Filed: Nov. 2, 1979

[51] Int. Cl.³ .......................................... H03K 3/353
[52] U.S. Cl. ................................ 307/304; 307/221 C; 307/571; 328/161; 340/347 AD
[58] Field of Search ............... 307/304, 221 C, 221 D, 307/251; 340/347 AD; 328/161

[56] References Cited

U.S. PATENT DOCUMENTS

| | | | |
|---|---|---|---|
| 3,610,960 | 10/1971 | Hofstein | 307/221 C |
| 3,976,894 | 8/1976 | Perkins, Jr. et al. | 307/251 |
| 4,014,238 | 3/1977 | Southard | 307/221 C |
| 4,138,665 | 2/1979 | Eichelberger et al. | 307/221 D |
| 4,197,472 | 4/1980 | Aoki et al. | 307/251 |
| 4,213,120 | 7/1980 | Buchanan | 307/221 D |
| 4,234,807 | 11/1980 | Esser et al. | 307/304 |

*Primary Examiner*—Saxfield Chatmon, Jr.
*Attorney, Agent, or Firm*—Richard M. Sharkansky; Joseph D. Pannone

[57] ABSTRACT

An electronic circuit, suitable for use in a digital-to-analog converter, wherein a ladder network is provided to obtain a 2:1 successive reduction in the amount of current flow through successive shunt arms of the ladder network. The ladder network includes a plurality of serially coupled resistance means, at least a portion thereof comprising a resistor and a serially coupled transistor, and a plurality of shunt coupled resistors disposed in the shunt arms of the ladder network. A plurality of pairs of switching transistors, each pair thereof being adapted for coupling to a pair of complementary switching signals produced in response to a bit of the digital word being converted, each one of the shunt resistors being coupled to a corresponding one of the pairs of switching transistors.

3 Claims, 4 Drawing Figures

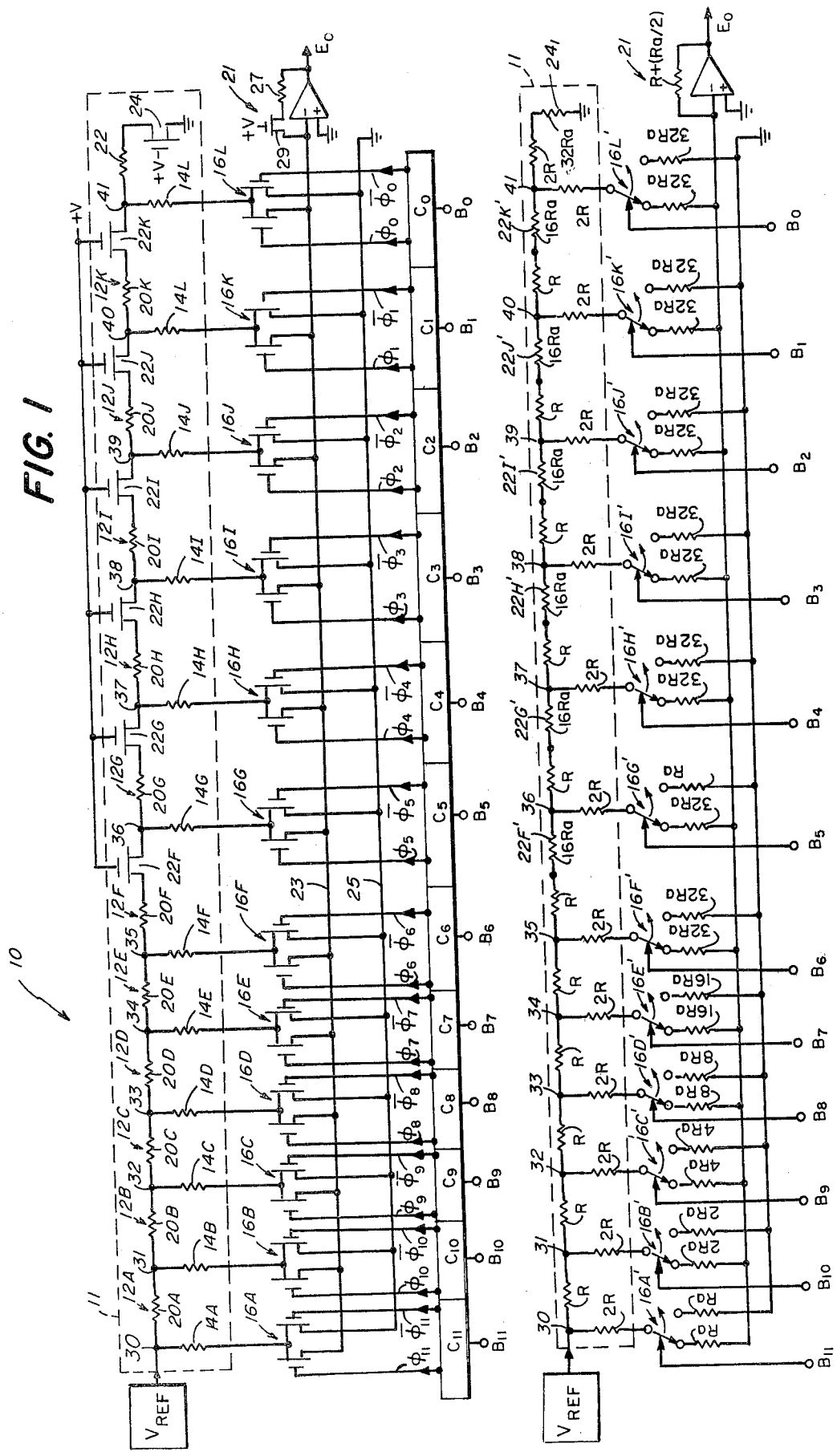

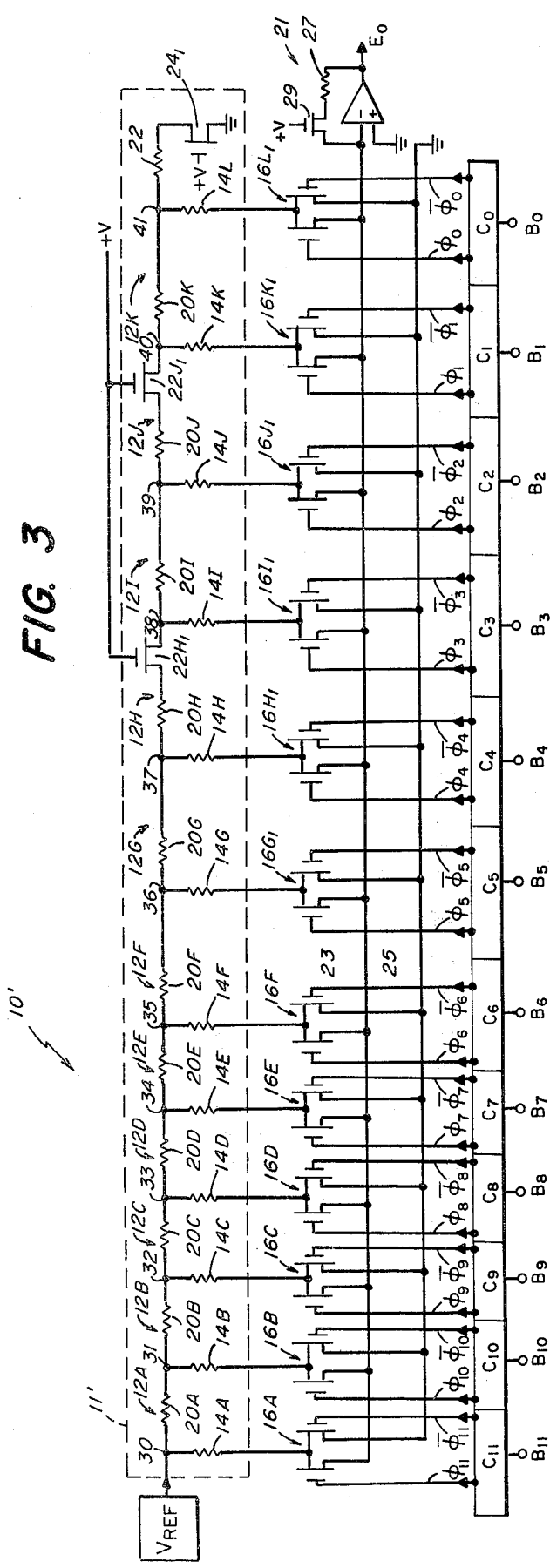

ELECTRONIC CIRCUITRY

BACKGROUND OF THE INVENTION

This invention relates generally to current divider circuitry and more particularly to current divider circuitry suitable for use in digital-to-analog converters.

As is known in the art, many digital-to-analog converters include current divider circuitry to produce a flow of current having a magnitude proportional to a magnitude represented by a digital word fed to such converter. One such current divider circuit includes a resistor ladder network which has a plurality of resistors disposed in shunt and series arms of such network. Generally the resistances of the resistors in the shunt arms are twice as large as the resistances of the resistors in the series arms. This type of ladder network is sometimes referred to as an R-2R ladder network. A voltage source is sometimes coupled to a first one of the shunt and series resistors of the network so that current flows from such voltage source to ground through each one of the shunt resistors with the amount of current flow through each one of the shunt resistors being successively reduced by a factor of 2:1 from the first one of the shunt resistors to the last one of the shunt resistors. Each one of the shunt resistors is connected to a switch which directs the current flowing through the resistor connected to it to ground via a first bus or a second bus selectively in accordance with a control signal fed to the switch. Each bit of the digital word fed to the digital to analog converter is used as the control signal for a corresponding one of the switches, and each switch directs current flowing through the shunt resistor connected to it to ground through either the first bus, as when the control signal fed to such switch represents a logical 1 bit, or the second bus, as when the control signal fed to such switch represents a logical 0 bit. The most significant bit is used as the control signal for the switch connected to the first shunt resistor of the ladder network and the least significant bit is used as the control signal for the switch connected to the last shunt resistor of the ladder network. Consequently, the magnitude of the current flow from the voltage source to ground through the first bus is proportional to the magnitude represented by the digital word fed to the converter.

One type of digital to analog converter which uses the R-2R ladder network includes a pair of field effect transistors for each one of the switches in the shunt arms of the network. The source electrodes of each one of the pair of transistors are connected to a corresponding one of the shunt resistors and the drain electrodes are connected to ground through the first and second buses, respectively. The bits of the digital word are fed to driver circuits to produce "true" and "complement" signals in response to each one of such bits. The "true" and "complement" signals produced in response to each bit are fed as switching signals to the gate electrode field effect transistors in series with a corresponding one of the shunt resistances to place a selected one of the pair of transistors in a conduction condition and the other one of the pair of transistors in a nonconduction condition. Therefore, current flowing through each one of the shunt resistors will be directed to ground through the source and drain electrodes of a selected one of the pair of transistors, such transistor being selected in accordance with the switching signals fed to the pair of transistors. When either one of the pair of transistors is in a conduction condition such transistor has some finite resistance between the source and drain electrodes. Consequently, in order to provide a true R-2R ladder network the conduction resistance of the transistors in successive shunt arms of the ladder network must be successively increased in order to precisely obtain a 2:1 successive reduction in the amount of current flow through the resistors of the ladder network. To put it another way, with such arrangement a successive 2:1 reduction in the current flow through the shunt resistors with the R-2R ladder network is obtained by maintaining the voltage at the terminals connecting the shunt resistors to the pairs of transistors at the same reference voltage. Consequently, if the current passing through one of the pair of transistors in the first shunt arm is twice as large as that current flowing in one of the pair of transistors in the next succeeding shunt arm the conducting resistance of the transistor in the first shunt arm must be half as large as the conducting resistance of the transistor in the next succeeding shunt arm. In this way the voltage drop across each one of the conducting transistors is the same and therefore the voltages at the terminals connecting the shunt resistors to the pairs of transistors are maintained at the same reference potential. That is, for example, if the conduction resistance of each one of the pair of transistors fed by the most significant bit of the digital word is in the order of 20 ohms, the conduction resistances of each one of pair of succeeding transistors must be 40 ohms, 80 ohms, etc.. In order to obtain the successively larger "on" resistances the size of the transistor must be correspondingly increased. It follows then that when such converter is to be formed as an integrated circuit having a fixed amount of surface area on each chip, the number of bits which such converter is able to operate on is limited. That is, for example, if a 12 bit digital to analog converter is desired, while the conduction resistance of each one of the first pair of transistors is, say, 20 ohms, the conduction resistances of each one of the succeeding pairs of transistors will have to be, with such arrangement, successively increased from 40 ohms to 42K ohms, thereby requiring the switching transistors to occupy a significantly large amount of area on the chip. Further, such large transistors have relatively large gate capacitances which increases their switching response time. Still further, since the conducting resistances of such transistors are relatively large, they must be formed with a high degree of accuracy.

One way suggested to obtain a proper 2:1 successive reduction in current flow is to modify the ladder network so that many of the least significant bit responsive transistors have the same conductive resistances but the shunt resistances connected to such transistors are correspondingly increased. With such arrangement, however, because the temperature variation effect on the conductive resistances of the active transistors is not matched to the temperature variation effect on the resistance of the passive shunt resistors, the temperature range of operation of a digital-to-analog converter using such arrangement is limited.

SUMMARY OF THE INVENTION

In accordance with the invention a ladder network is provided having a plurality of serially coupled resistance means and a plurality of shunt coupled resistors, each one of the series resistance means being coupled between a pair of the shunt coupled resistors. Each one of the shunt coupled resistors is coupled to a pair of switching transistors adapted to be placed in complementary conducting or nonconducting conditions selectively in accordance with complementary switching signals fed to such pair of switching transistors. At least a portion of the shunt resistors in the ladder network is coupled to pairs of the switching transistors having equal conducting resistances. The series resistance means coupled between the pairs of shunt resistors in this portion of the ladder network includes a transistor adapted for biasing into a conducting condition. The conducting resistance of at least one of the transistors in such series resistance means, when such transistor is biased in the conducting condition, is substantially half the sum of the conducting resistances of a pair of the switching transistors between which such series resistance means is coupled.

In a preferred embodiment of the invention the ladder network is used in a digital-to-analog converter. The portion of the shunt resistors in the ladder network is connected to pairs of transistors which respond to the lower order (i.e. least significant) bits of the digital word being converted.

With such arrangement such a digital-to-analog converter may be provided for operation with digital words having a relatively large number of bits since the conducting resistances of the pairs of switching transistors used to respond to the lower order bits of such word may be relatively small, thereby reducing the chip area required to manufacture such converter as an integrated circuit. Further, because the converter is suitable for fabrication as an integrated circuit on a single crystal substrate, the transistors in the series resistance means have conducting resistances which vary in temperature in a manner similar to the variation in the conducting resistances of the transistors connected to the shunt resistors the converter is adapted to operate over a wide range of temperatures.

BRIEF DESCRIPTION OF THE DRAWINGS

The foregoing features of this invention, as well as the invention itself, may be more fully understood from the following detailed description read together with the accompanying drawing, in which:

FIG. 1 is a schematic diagram of a digital-to-analog converter according to the invention;

FIG. 2 is a an equivalent circuit diagram useful in understanding the operation of the converter of FIG. 1;

FIG. 3 is a schematic diagram of an alternate embodiment of a digital-to-analog converter according to the invention; and FIG. 4 is an equivalent circuit diagram useful in understanding the operation of the converter of FIG. 3.

DESCRIPTION OF THE PREFERRED EMBODIMENTS

Referring now to FIG. 1, a digital-to-analog converter 10 is shown, suitable for fabrication on a single crystal body, here silicon, to include a ladder network 11 having a plurality of, here 11, serially coupled resistance means, 12A–12K, and a plurality of, here 12, shunt resistors 14A–14L, each one of the series resistance means 12A–12K being coupled between a pair of the shunt coupled resistance means 14A–14L, as shown. Shunt coupled resistors 14A–14L are serially coupled to pairs of field effect transistors 16A–16L, respectively, as shown. The source electrode of the pairs of transistors 16A–16L are coupled to the resistors 14A–14L, respectively, as indicated. The drain electrodes of one of the pair of transistors 16A–16L (i.e. the left hand one of the pair of transistors 16A–16L) are connected to an operational amplifier 21 through a common output bus 23 and the drain electrodes of the other one of the pair of transistors 16A–16L (i.e. the right hand one of the pair of transistors 16A–16L) are coupled to ground through a common bus 25, as shown. The gate electrodes of the pair of field effect transistors 16A–16L are fed by the bits $B_{11}$–$B_0$ of a digital word (here a 12 bit digital word) being converted through driver circuits $C_{11}$–$C_0$, respectively. Each one of the driver circuits $C_{11}$–$C_0$ is of any conventional design and produces "true" and "complementary" signals on lines $\phi_{11}$, $\overline{\phi}_{11}$ to $\phi_0$, $\overline{\phi}_0$, respectively, as shown. That is, if bit $B_{11}$ is a logical 1, a "high" positive voltage is produced on line $\phi_{11}$, and a "low" voltage is produced on line $\overline{\phi}_{11}$. Conversely, if bit $B_{11}$ is a logical 0, a "low" voltage is produced on line $\phi_{11}$ and a "high" positive voltage is produced on line $\overline{\phi}_{11}$. Similar "true" and "complementary" signals are produced on lines $\phi_{10}$, $\overline{\phi}_{10}$–$\phi_0$, $\overline{\phi}_0$ in response to bits $B_{10}$–$B_0$, respectively. The most significant bit (MSB), $B_{11}$ of such digital word is fed to the gate electrodes of the pair of transistors 16A through driver circuit $C_{11}$ and the least significant bit (LSB), $B_0$, of such digital word being fed to the gate electrodes of the pair of field effect transistors 16L through circuit $C_0$. The intermediate bits, $B_{10}$–$B_1$ are fed to the gate electrodes of the pairs of transistors 16B–16K, through driver circuits $C_{10}$–$C_1$, respectively, as indicated. When the logical signal represented by one of the bits of such digital word is a logical 1 the left hand one of the pair of transistors 16A–16L fed by such bit is here placed in a conducting condition and the right hand one of the pair of transistors 16A–16L fed by such bit is placed in a nonconducting condition. Conversely, when the logical signal represented by one of the bits of such digital word is a logical 0 the left hand one of the pair of transistors 16A–16L fed by such bit is here placed in a nonconducting state and the right hand one of the pair of transistors 16A–16L is placed in a conducting state. It follows then that current flowing through each one of the shunt resistors 14A–14L will be directed through a selected one of the pair of transistors 16A–16L coupled thereto. Therefore, current flowing through shunt resistors 14A–14L will be directed to either bus 23 or bus 25 selectively in accordance with the logical state of bits $B_{11}$–$B_0$.

Series resistance means 12A–12E includes fixed resistors 20A–20E and series resistance means 12F–12K includes fixed resistors 20F–20K and serially coupled field effect transistors 22F–22K, as shown. The field effect transistors 22F–22K are formed on the same single crystal substrate as the transistors 16A–16L and have conducting resistances which vary in temperature in a way similar to the temperature variation of the conducting resistances of transistors 16A–16L, that is, all the transistors in the converter 10 are "matched". The shunt resistance means 14A and the series resistance means 12A are connected together at terminal 30. A voltage reference source $V_{REF}$ is also connected to terminal 30, as shown. The shunt resistor 14L and the series resistance means 22K are connected together at terminal 41, as shown. Also connected to terminal 41 is a fixed resistor 22 in series with a field effect transistor 24, as shown. The gate electrode of transistor 24 is coupled to a suitable voltage source, +V, (here 15 volts) to bias such transistor to conduction. Transistors 22F-22K have gate electrodes coupled to a suitable voltage source +V (here 15 volts) to bias such transistors to conduction. The resistance through the source and drain electrodes of each one of the transistors 22F-22K, when biased to conduction, i.e. the "on" or conducting resistance, is here 320 ohms. The resistance through the source and drain electrodes of transistor 24 when such transistor 24 is biased to its conducting condition is here 640 ohms.

The "on" or conducting resistances of each one of the pairs of transistors 16A-16L here are as follows: each one of the transistors 16A has a conducting resistance of 20 ohms, each one of the pair of transistors 16B has a conducting resistance of 40 ohms, each one of the pair of transistors 16C has a conducting resistance of 80 ohms, each one of the pair of transistors 16D has a conducting resistance of 160 ohms, and each one of the pair of transistors 16E to 16L has a conducting resistance of 320 ohms. The resistances of each one of the fixed resistors 20A-20F and 20G-20K is here 10K ohms. The resistances of each one of the fixed resistors 14A-14L and the resistance of fixed resistor 22 is here 20K ohms.

Referring now to FIG. 2, an equivalent circuit of the ladder network used in the converter 10 is shown with each one of the transistors 16A-16L being represented by a single pole-double throw switch 16'-16L' and a pair of resistors representing the "on" or conducting resistance of each one of the pair of transistors 16A-16L, respectively. Further, transistors 22F-22K and transistor 24 are represented by the equivalent conducting resistances 22F'-22K' and 24', respectively. Still further, the switches 16A'-16L' are activated by bits $B_{11}$-$B_0$ of the digital word to selectively couple current flowing through shunt resistors 14A-14L (FIG. 1) to either bus 23 or 25 selectively in accordance with the logical state of such bits $B_{11}$-$B_0$ as discussed above in connection with FIG. 1. It is noted that the resistance of fixed resistors 14A-14L and 22 (FIG. 1) are each 2R ohms, here 20K ohms as noted above, the resistances of fixed resistors 20A-20K are R ohms, here 10K ohms. The conducting resistances of each one of the pairs of transistors 16A, 16B, 16C, 16D, 16E and 16F are $R_a$, 2 $R_a$, 4 $R_a$, 8 $R_a$, 16 $R_a$ and 32 $R_a$, respectively, as indicated, here $R_a$ being 20 ohms as noted above, and the conducting resistances of transistors 16G to 16L and transistor 24 are each 32 $R_a$, as indicated. The conducting resistances of transistors 22G-22K are each 16 Ra, as indicated. It is noted that current will flow from the reference voltage source through each one of the shunt resistors 14A to 14L (FIG. 1) to ground either through grounded bus 25 or through operational amplifier 21 and bus 23 regardless of the logical states of the bits $B_{11}$-$B_0$. Current passing into terminal 41 is divided equally to ground through two paths (one path being through resistor 14L and the other being through resistor 22) because the resistances of each one of the paths are equal, here 32 $R_a$+2R ohms. It is noted that the total resistance between terminal 41 and ground is (32 $R_a$+2 R)/2 ohms. Therefore, current passing into terminal 40 also divides equally into two paths (one through resistor 20K and the other through resistor 14K) because the resistances of each one of the paths are equal, here (32 $R_a$+2 R) ohms. It is noted that the total resistance between terminal 40 and ground is (32 $R_a$+2 R)/2 ohms. Continuing, it will become evident that current passing through each one of the terminals 30-41 becomes equally divided into two paths, one path being through the shunt resistors 14A-14L connected to such terminals and the other through the series resistance means 12A-12K (and resistor 22) connected to such terminals. Therefore, if the total flow of current from the reference voltage source to terminal 30 is I=$V_{REF}$/[R+($R_a$/2)], the flow of current through shunt resistors 14A-14L will be I/2, I/4, I/8, I/16, I/32, I/64, I/128, I/256, I/512, I/1024, I/2048 and I/4096, respectively, and the flow of current through transistor 24 will also be I/4096 where I is here 1 milli-ampere. It follows then that the total flow of current through output bus 23 of the converter will be proportional to the magnitude of the digital word, $B_{11}$-$B_0$ fed to the converter. Such current flow is converted to a corresponding voltage by the operational amplifier 21 made up of a differential amplifier having its +terminal connected to ground and its −termimal connected to the bus 23. The output $E_O$ of the amplifier 21 is connected to the −terminal thereof through a resistor 27, here R ohms, and a field effect transistor 29 biased to a conducting condition through a +V source, here 15 volts. The conducting resistance of transistor 29 is here $R_a$/2 ohms. Further, the transistor 29 is formed on the same single crystal body as the other transistors of the converter 10 and hence the transistor 29 are matched to the transistors in the pair of transistors 16A. It is noted, however, that the "on" or conducting resistances of transistors 16F to 16L are equal to each other, i.e., 32 $R_a$, and therefore the largest "on" resistance required for the switching transistors 16A-16L is here 640 ohms.

It is also noted that while the conducting resistance of a transistor is a function of the gate-to-source (or drain) voltage, transistors 22F-22K are inserted into the ladder network at points where the voltages at terminals 36-41 are only in the order of 1% (or less) of the gate voltage V, here 15 volts, and therefore there is little variation in the conducting resistance of the transistors 22F-22K where such transistors have matched characteristics.

Referring now to FIG. 3, an alternative digital-to-analog converter 10' is shown. Here only two field effect transistors $22H_1$ and $22J_1$ are used in the series resistance means 12H and 12J of the ladder network 11', as shown. Further, while the conducting resistances of transistors 16A-16F are $R_a$ to 32 $R_a$, respectively, as in the converter 10 shown in FIG. 1, the conducting resistance of each one of the pair of transistors $16G_1$ is 64 $R_a$ ohms (where $R_a$ is here 20 ohms); the conducting resistance of each one of the pair of transistors $16H_1$ is 128 $R_a$ ohms; the conducting resistance of each one of the pair of transistors $16I_1$ is 64 $R_a$ ohms; the conducting resistance of each one of the transistors $16J_1$ is 128 $R_a$ ohms; the conducting resistance of each one of the pair of transistors $16K_1$ is 64 $R_a$ ohms; and the conductivity resistance of each one of the pair of transistors $16L_1$ is 128 $R_a$ ohms as shown in the equivalent circuit of FIG. 4. The conducting resistances of transistors $22H_1$ and $22J_1$ are each 96 $R_a$, as shown in the equivalent circuit of FIG. 4. The conducting resistance of transistor $24_1$ is 128 $R_a$, as shown in FIG. 4. Here again there is a successive 2:1 reduction in the current flow through the shunt resistors 14A-14K as in the converter 10 of FIG. 1. Here, however, while a conducting resistance of 128 $R_a$ is required for each one of the pairs of transistors $16H_1$, $16J_1$ and $16L_1$, the number of series connected transistors is reduced and hence the number of interconnects to such transistors $22H_1$, $22J_1$ form the ladder network to such transistors $22H_1$ to $22J_1$ is reduced.

Having described preferred embodiments of the invention, it is now evident that other embodiments incorporating these concepts may be used. For example, the number of shunt resistances may be increased or decreased in accordance with the number of bits in the digital word being converted. Further, other resistance values may be used in the shunt and series arms of the network. Still further, transistors having different conducting resistances from those disclosed may be used. It is felt, therefore, that this invention should not be restricted to the disclosed embodiment, but rather should be limited only by the spirit and scope of the appended claims.

What is claimed is:

1. An electronic circuit for converting a digital word into an analog signal, such circuit comprising:
   a plurality of serially coupled resistance means, at least a portion of such serially coupled resistance means comprising:
   (i) a resistor;
   (ii) a transistor serially connected to the resistor; and,
   (iii) means for biasing such transistor to conduction to provide such transistor with a predetermined conducting resistance;
   a plurality of shunt coupled resistors, each one of the plurality of serially coupled resistance means being coupled between a pair of the shunt coupled resistors;
   a plurality of pairs of switching transistors, each one of the plurality of shunt coupled resistors being serially coupled to a corresponding one of the plurality of pairs of switching transistors;
   means, responsive to each one of the bits of digital words, for producing a pair of complementary switching signals in response to each one of the bits;
   means for coupling each one of the pairs of switching transistors to a corresponding one of the pair of complementary switching signals, a first one of the pair of switching transistors in each of the pairs thereof being coupled to one of the pair of complementary switching signals and a second one of the pair of switching transistors in each of the pairs thereof being coupled to the other one of the pair of complementary switching signals, including means for placing one of the switching transistors in each of the pairs thereof in a conducting condition and the other one of such switching transistors in each of the pairs thereof in a nonconducting condition selectively in accordance with the bits of the digital word fed to the pair of switching transistors;
   wherein the conducting resistance of the transistors in the serially coupled resistance means compensates for conducting resistances of the conducting switching transistors to provide successive two-to-one current flow reductions in currents passing through successive ones of the shunt coupled resistors; and
   means responsive to the current flow through the first one of the switching transistors in the pairs thereof for producing the analog signal.

2. Current divider circuitry comprising:
   a ladder network means, adapted for coupling to a voltage source, for separating current supplied by the voltage source into a plurality of successively coupled shunt paths in a predetermined pattern with the amount of current in a succeeding shunt path being a predetermined fraction of the amount of current in the preceeding shunt path, such network comprising:
   (i) a plurality of serially coupled resistance means, at least a portion of such resistance means comprising: a resistor; a serially coupled transistor; and means for biasing such transistor to conduction with a predetermined conducting resistance; and
   (ii) a plurality of shunt coupled resistors, each one of the series coupled resistance means being coupled between a pair of the shunt coupled resistors, each one of the shunt coupled resistors being disposed in a corresponding one of the shunt paths;
   a plurality of pairs of switching transistors, each one of the shunt coupled resistors being serially coupled to a pair of the plurality of pairs of switching transistors and each one of the pairs of transistors being adapted for coupling to a pair of complementary switching signals to place a selected one of such switching transistors in the pairs thereof in conduction; and
   wherein the conducting resistance of the transistor in the serially coupled resistance means compensates for the conducting resistance of the conducting one of the transistors in the pairs thereof to provide the predetermined current pattern separation.

3. The circuitry recited in claim 2 wherein the conducting resistance of the serially coupled transistor in at least one of the serially coupled resistance means is substantially half the sum of the conducting resistances of the conducting ones of the transistors in the pairs of the switching transistors between which such one of the serially coupled resistance means is coupled.

* * * * *

UNITED STATES PATENT OFFICE
CERTIFICATE OF CORRECTION

Patent No. 4,308,467          Dated December 29, 1981

Inventor(s) M. V. Kolluri and Clyde M. Brown, Jr.

It is certified that error appears in the above-identified patent and that said Letters Patent are hereby corrected as shown below:

Abstract, line 11, delete --compl-- and replace with --comple--;

Column 2, line 53, delete --resistances-- and replace with --resistance--;

Column 6, line 17, delete --termimal-- and replace with --terminal--.

Signed and Sealed this

Twenty-seventh Day of April 1982

[SEAL]

Attest:

GERALD J. MOSSINGHOFF

Attesting Officer          Commissioner of Patents and Trademarks